United States Patent [19]

Chan

[11] Patent Number: 5,407,846

[45] Date of Patent: Apr. 18, 1995

[54] METHOD OF MANUFACTURING A THIN FILM TRANSISTOR

[76] Inventor: Ha H. Chan, Jukong Apt. 706 dong 1208 ho, Haan-dong, Kwangmyung-si Kyoungki-do, Rep. of Korea

[21] Appl. No.: 85,559

[22] Filed: Jun. 30, 1993

[30] Foreign Application Priority Data

Jul. 1, 1992 [KR] Rep. of Korea .................. 92-11679

[51] Int. Cl.⁶ .......................................... H01L 21/265
[52] U.S. Cl. ..................................... 437/41; 437/101; 437/909; 437/160; 257/57; 257/59
[58] Field of Search ................... 437/21, 40, 909, 41, 437/101; 257/57, 59

[56] References Cited

U.S. PATENT DOCUMENTS

| | | | |
|---|---|---|---|
| 5,160,491 | 11/1992 | Mori | 437/40 |
| 5,229,310 | 7/1993 | Sivan | 437/41 |
| 5,250,450 | 10/1993 | Lee et al. | 437/40 |

Primary Examiner—Olik Chaudhuri
Assistant Examiner—Richard A. Booth

[57] ABSTRACT

There is provided a TFT having a trench surrounding gate structure that is capable of decreasing the leakage current generated during the Off-State of the TFT by securing enough channel length despite the smallness of the area, increasing the driving current by securing a sufficient cross-sectional area of an inverted channel during the On-State of the TFT, and improving the resolution of the LCD by reducing the space occupied by the TFT in the panel during the manufacturing of the LCD.

9 Claims, 3 Drawing Sheets

1

METHOD OF MANUFACTURING A THIN FILM TRANSISTOR

BACKGROUND OF THE INVENTION

Field of the Invention

This invention relates to a Thin Film Transistor (TFT) used in a Static Random Access Memory (SRAM) or Liquid Crystal Display (LCD) and a method of manufacturing thereof, and more particularly to a TFT having a trench surrounding gate structure that is capable of decreasing the leakage current generated during the Off-State of the TFT by securing a sufficient channel despite the smallness of the area, increasing the driving current by securing enough cross-sectional area of an inverted channel during the On-State of the TFT, and improving the resolution of LCD by reducing the space occupied by the TFT in a panel during the manufacturing of the LCD, and a method of manufacturing the TFT thereof.

Following the conventional method of manufacturing a TFT, a silicon layer used as a TFT channel is flatly formed over an insulating layer, and a TFT gate insulating layer and TFT gate are formed on the silicon layer. Finally, a TFT source and drain are formed by implanting impurities into the silicon layer for a TFT channel.

However, when the conventional method is applied manufacturing a highly integrated SRAM, the area of unit cell is increased so that the chip size is increased. Moreover, the area occupied by the TFT must be minimized during the manufacturing process of the LCD. Therefore, in such case, when applying the typical TFT structure, the resolution of LDC deteriorates.

SUMMARY OF THE INVENTION

It is an object of the present invention to provide a TFT having a trench surrounding structure which is formed to secure a sufficient channel length in a small area.

It is another object of the present invention to provide a TFT which is formed to increase the driving current during the ON-State of the TFT by forming TFT gates on the upper/lower parts of the TFT channel.

BRIEF DESCRIPTION OF THE DRAWINGS

FIG. 1 is a cross-sectional view that illustrates the formation of a trench on a first oxide layer and silicon nitride layer.

FIG. 2 is a cross-sectional view illustrating a second oxide pattern formed along the surface of the trench and the sidewall.

FIG. 3 is a cross-sectional view illustrating a channel formed between the trench and silicon layer.

FIG. 4 is a cross-sectional view that illustrates the formation of a TFT source and drain after a TFT gate oxide layer and TFT gate are formed.

DETAILED DESCRIPTION OF THE INVENTION

The embodiments of the present invention will be explained in detail by referring to the accompanying drawings.

Figure 3:
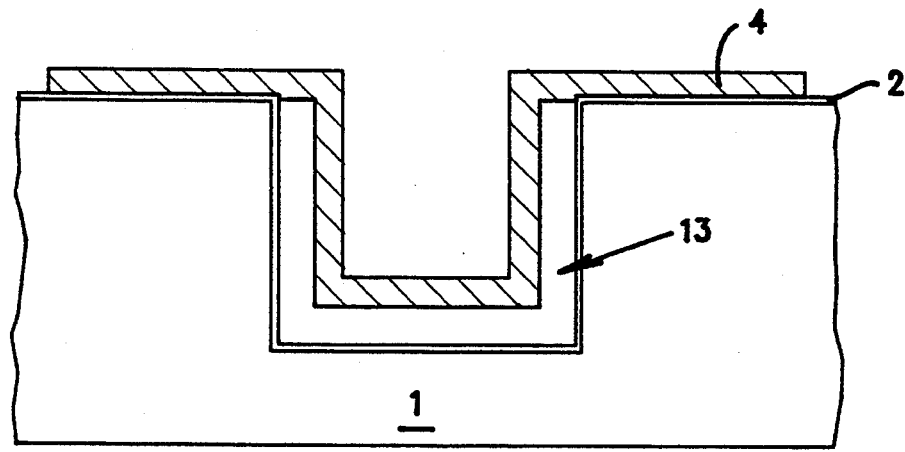
Figure 4:
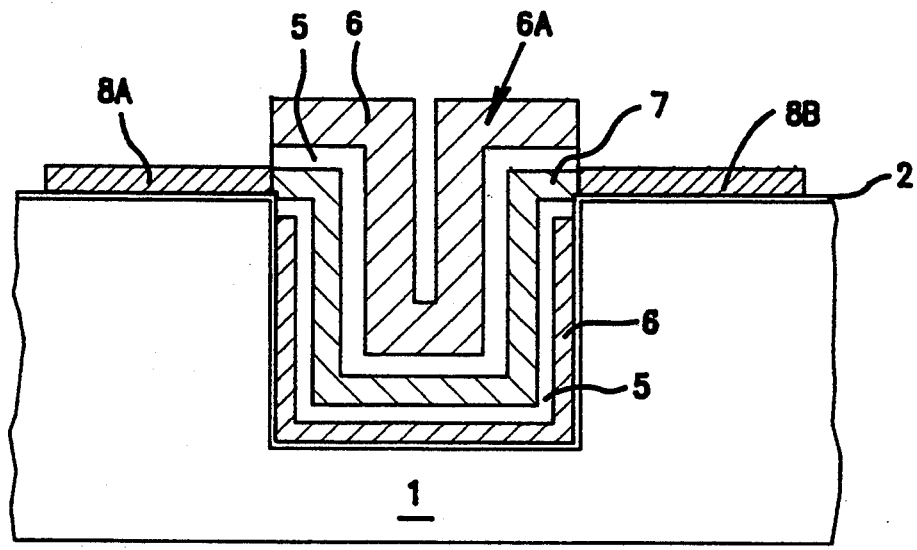
Figure 5:
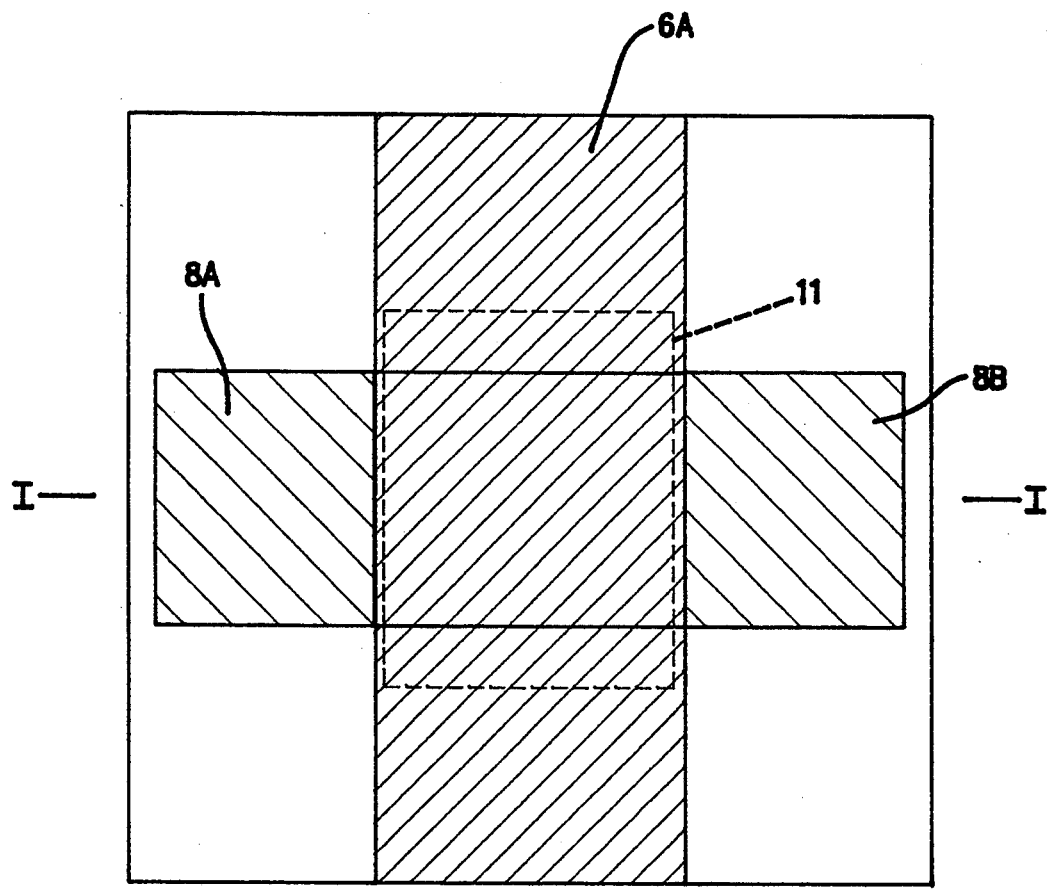
FIG. 5 is a plane view of the TFT showing a source, drain, and gate.

FIG. 1 through FIG. 4 are cross-sectional views shown along I—I of FIG. 5 that illustrate the manufacturing steps of a TFT having a trench surrounding gate structure according to the present invention.

Figure 1:
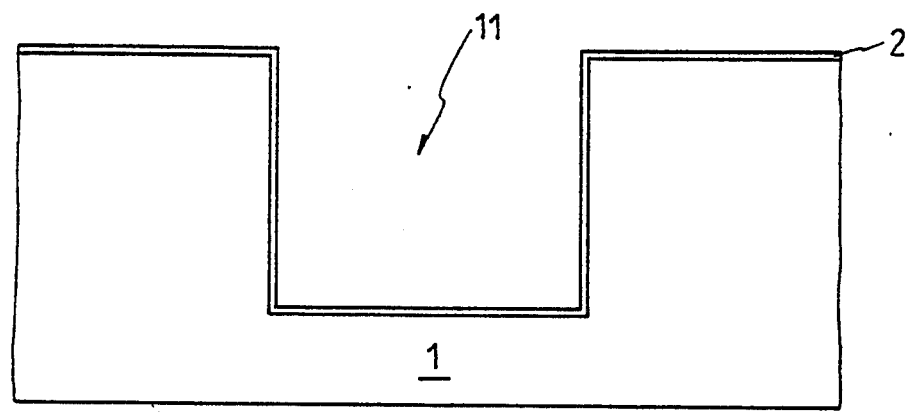
FIG. 1 through FIG. 4 are cross-sectional views shown along I—I of FIG. 5 that illustrate the manufacturing steps of a TFT having a trench surrounding gate structure according to the present invention.

FIG. 1 is a cross-sectional view that illustrates the formation of a trench 11 on a first oxide layer 1 and silicon nitride layer 2. As shown in FIG. 1, for forming a trench 11, a mask (not illustrated in FIG. 1) is formed over the first oxide layer 1 and a trench 11 is formed by etching the predetermined depth of the exposed first oxide layer 1. Thereafter, the mask is removed and then, a thin silicon nitride layer 2 is deposited on the surface of the first oxide layer 1, where the silicon nitride layer 2 is used as a barrier layer when a second oxide layer 3 to be formed in a later manufacturing process is etched.

Figure 2:
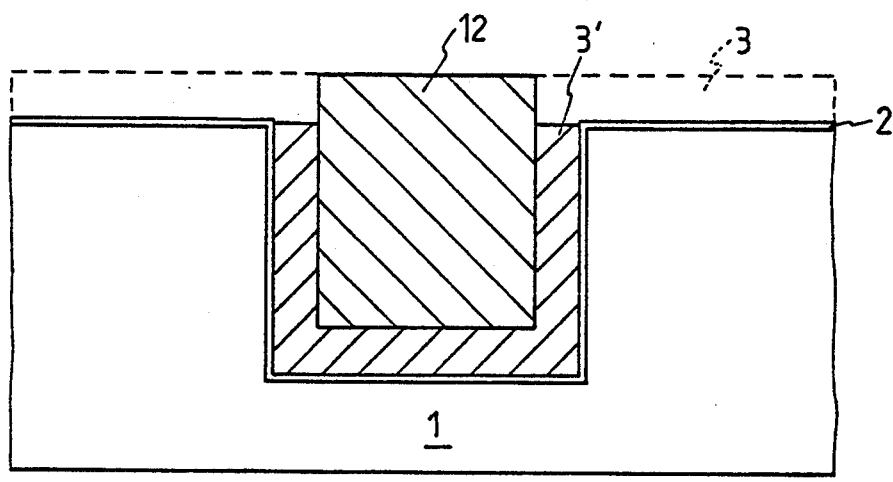

FIG. 2 is a cross-sectional view illustrating a second oxide pattern 3' formed along the surface of the trench 11 and the sidewall. As shown in FIG. 2, a second oxide layer 3 having the predetermined thickness is deposited on the silicon nitride layer 2 and then, a photoresist layer 12 is flatly coated over the second oxide layer 3. Thereafter, the photoresist layer 12 is etched through the etchback process until the top surface of the second oxide layer 3 (illustrated with dot lines) is fully exposed and then, the exposed second oxide layer 3 is etched so that the second oxide layer 3 is remained on the lower part of the trench 11 and the sidewall. Therefore, the second oxide layer pattern 3' is formed.

However, in such cases, the predetermined thickness of the silicon nitride layer 2 instead of the second oxide layer 3 can be deposited on the first oxide layer 1 and the photoresist layer 12 is formed only on the trench 11. Thereafter, the exposed silicon nitride layer 2 is etched so that the silicon nitride layer 2 is remained on the lower part of the trench 11 and the sidewall. Therefore, a silicon nitride pattern can be formed.

FIG. 3 is a cross-sectional view illustrating a channel formed between the trench 11 and silicon layer 4. As shown in FIG. 3, a silicon layer 4 for a channel, comprising a polysilicon layer or amorphous silicon layer, is deposited over the entire surface after removing the photoresist layer 12 and then, a silicon layer pattern for a channel is formed, where the silicon layer 4 for a channel is remained only on the region for a channel, source, and drain through the lithographic technique. Thereafter, a tunnel 13 having the predetermined width is formed on the upper part of the trench by removing the second oxide layer pattern 3' at the lower part of the silicon layer 4 for the channel through the wet etching process.

FIG. 4 is a cross-sectional view that illustrates the formation of a TFT source and drain after a TFT gate oxide layer and TFT gate are formed. As shown in FIG. 4, a TFT gate oxide layer 5 is formed over the upper and lower parts of the silicon layer 4 for a channel and then, a silicon layer 6 for a TFT gate 6A is deposited on the surface of the gate oxide layer 5 to be formed on the silicon layer 4 and inside the tunnel. Thereafter, a TFT gate 6A is formed by etching the predetermined region of an oxide layer 6 for a TFT gate 6A through the lithographic technique. Moreover, a source 8A and drain 8B are formed by implanting an N-type impurity on the exposed silicon layer in case a P-type impurity is doped on the silicon layer 4 or by implanting a P-type impurity on the exposed silicon layer in case an N-type impurity is doped on the silicon layer. In such cases, the silicon layer 4 on which the impurity is not implanted is used as a channel 7. Here, for forming a source 8A and drain 8B, the impurity can be implanted using the solid source.

FIG. 5 is a plane view of the TFT showing a source 8A, drain B, and gate 6A. As shown in FIG. 5, TFT channel is formed at the overlapped region of the trench 11 (indicated as dot line) and gate 6A.

By applying the manufacturing steps of the present invention, a channel length is increased by forming a curved TFT channel along the surface of the trench 11 so that the leakage current is reduced during the OFF-State of the TFT. Also, by forming a TFT gate on the upper and lower sides of the the TFT channel, the driving current is increased by a large cross-sectional area of the inverted channel during the ON-State of the TFT. The space occupied by the unit cell can be reduced during the manufacturing process of TFT having the same channel length so that the integration of SRAM can be improved.

Moreover, since the space occupied by the TFT in a highly integrated LCD can be minimized during the manufacturing of the TFT having the same channel length, a higher resolution of the LCD can be achieved.

Although this invention has been described in its preferred form with a certain degree of particularity, it is appreciated by those skilled in the art that the present disclosure of the preferred form has been made only by way of example and that numerous changes in the details of the construction, combination, and arrangement of parts may be restorted to without departing from the spirit and scope of the invention.

What is claimed is:

1. A method of manufacturing a thin film transistor having a trench surrounding gate structure comprising the steps of:

forming a mask for a trench over a first oxide layer;
   etching said first oxide layer so that a trench is formed;
   removing said mask;
   depositing a silicon nitride layer on the surface of said first oxide layer;
   depositing a second oxide layer on said silicon nitride layer, said second oxide layer having a portion within said trench and a portion outside said trench;
   coating flatly a photoresist layer over said second oxide layer;
   etching said photoresist layer through an etchback process until the top surface of the portion of said second oxide layer outside said trench is fully exposed;
   forming a second oxide pattern by etching the exposed portion of said second oxide layer;
   depositing a silicon layer for a channel after removing said photoresist layer;
   forming a silicon pattern for a channel, said silicon pattern having one of a P-type or N-type doping;
   removing said second oxide pattern on the lower part of said silicon layer for the channel through a wet etching process so that a tunnel is formed within said trench.
   forming a gate oxide layer on said silicon layer for a channel;
   depositing a silicon layer for a gate on the upper surface add the inside the tunnel surface of said gate oxide layer;
   etching said silicon layer for a gate and said gate oxide layer so that a gate is formed and said silicon pattern for a channel has exposed silicon layer portions; and
   implanting an N-type impurity in said exposed silicon layer portions if said silicon pattern for a channel has a P-type doping or implanting a P-type impurity in said exposed silicon layer portions if said silicon pattern for a channel has an N-type doping so that a source and a drain are formed and a portion of said silicon layer for a channel on which said impurities are not implanted is used as a channel.

2. The method of manufacturing the Thin Film Transistor of claim 1, wherein the source and said drain are formed by diffusing impurity from a solid source.

3. A method of manufacturing a thin film transistor having a trench surrounding gate structure comprising the steps of:

forming a mask for a trench over a first insulating layer;
   etching said first insulating layer so that a trench is formed;
   removing said mask;
   depositing a second insulating layer on the surface of said first insulating layer;
   depositing a photoresist only in said trench;
   forming a second insulation pattern by etching the exposed portion of said second insulating layer;
   depositing a silicon layer for a channel after removing said photoresist;
   forming a silicon pattern for a channel, said silicon pattern having one of a P-type or N-type doping;
   removing said second insulation pattern on the lower part of said silicon layer for the channel through a wet etching process so that a tunnel is formed in said trench;
   forming a gate oxide layer,over the upper and lower parts of said silicon pattern for a channel;
   depositing a silicon layer for a gate on the upper surface and inside the tunnel surface of said gate oxide layer;
   etching said silicon layer for a gate and said gate oxide layer so that a gate is formed and said silicon pattern for a channel has exposed silicon layer portions; and
   implanting an N-type impurity in said exposed silicon layer portions if said silicon pattern for a channel has a P-type doping or implanting a P-type impurity in said exposed silicon layer portions if said silicon pattern for a channel has an N-type doping so that a source and a drain are formed and a portion of said silicon pattern for a channel on which said impurities are not implanted is used as a channel.

4. The method of manufacturing the thin film transistor of claim 3, wherein an etch selectivity of the first insulating layer with respect to said second insulating layer is greater.

5. The method of manufacturing the thin film transistor of claim 3, wherein said gate comprises polysilicon.

6. The method of manufacturing the thin film transistor of claim 3, wherein said channel comprises polysilicon or amorphous silicon.

7. The method of manufacturing the Thin Film Transistor of claim 3, wherein said first insulating layer comprises a silicon dioxide layer.

8. The method of manufacturing the Thin Film Transistor of claim 3, wherein said second insulating layer comprises a silicon nitride layer.

9. The method of manufacturing the Thin Film Transistor of claim 3, wherein said source and said drain are formed by diffusing an impurity from a solid source.

* * * * *

UNITED STATES PATENT AND TRADEMARK OFFICE
CERTIFICATE OF CORRECTION

PATENT NO.   : 5,407,846
DATED        : April 18, 1995
INVENTOR(S)  : Hyoung Chan Ha It is certified that error appears in the above-indentified patent and that said Letters Patent is hereby corrected as shown below:

On the title page, item [76] insert:--Hyoung Chan Ha--;

Column 1, line 30, before "manufacturing" please insert --for--;

Column 3, line 10, "B" should be --8B--;

Column 3, line 66, "trench." should be --trench;--;

Column 4, line 2, "add" should be --and--;

Column 4, line 2, please delete the first occurrence of "the"; and

Column 4, line 42, "layer,over" should be --layer over--.

Signed and Sealed this

Fourth Day of July, 1995

Attest:

BRUCE LEHMAN

*Attesting Officer*    *Commissioner of Patents and Trademarks*